United States Patent [19]

Galicki et al.

[11] 4,238,312

[45] Dec. 9, 1980

[54] SPUTTERING SYSTEM FOR OPTIMIZING QUARTZ DEPOSITION UNIFORMITY

[75] Inventors: Arkadi Galicki, San Jose, Calif.; Carl P. Hayunga, Poughkeepsie; Homi G. Sarkary, Hopewell Junction, both of N.Y.

[73] Assignee: International Business Machines Corporation, Armonk, N.Y.

[21] Appl. No.: 59,718

[22] Filed: Jul. 23, 1979

[51] Int. Cl.³ .............................................. C23C 15/00
[52] U.S. Cl. ................................. 204/298; 204/192 D
[58] Field of Search ............................ 204/192 D, 298

[56] References Cited

U.S. PATENT DOCUMENTS 4,153,528  5/1979  Galicki et al. .................... 204/192 R

OTHER PUBLICATIONS

S. S. Scianna, "Improving Uniformity of Sputtered Quartz," *IBM Technical Disclosure Bulletin*, vol. 13, No. 6, Nov. 1970, p. 1448.

M. M. Gartner et al., "Compensation Mechanism For Uniform Sputtering," *IBM Technical Disclosure Bulletin*, vol. 19, No. 2, Jul. 1976, pp. 516–517.

*Primary Examiner*—Aaron Weisstuch
*Attorney, Agent, or Firm*—James M. Thomson; James R. McBride

[57] ABSTRACT

A sputtering system adapted for depositing quartz in uniform thicknesses upon multiple wafers processed in batches including an anode plate having a plurality of wafer locations spaced from the center of the anode, with each wafer location comprising a wafer receiving recess in the anode plate having an angular bottom slope which, in effect, tilts the wafer to an optimum deposition angle with respect to the cathode, depending upon wafer spacing from the center of the anode, to insure uniform deposition across the wafer.

4 Claims, 3 Drawing Figures

SPUTTERING SYSTEM FOR OPTIMIZING QUARTZ DEPOSITION UNIFORMITY

DESCRIPTION OF THE INVENTION

TECHNICAL FIELD

The present invention relates to the field of sputtered deposition of quartz. More particularly, the invention relates to a method and apparatus for providing deposition or removal of quartz in uniform thicknesses upon wafers processed in multiple batches.

Accordingly, it is an object of the invention to provide a method and apparatus for depositing sputtered quartz in uniform thicknesses upon wafers.

It is another object of the invention to provide a method and apparatus for accomplishing uniform quartz thickness deposition upon wafers processed in multiple batches.

It is yet a further object of the invention to provide an improved anode plate design wherein a plurality of wafer locations are provided, each spaced from the center of the anode plate and comprising a wafer receiving recess in the anode having an angular bottom slope which, in effect, tilts the wafer to an optimum deposition angle with respect to the cathode depending upon the spacing of the wafer location from the center of the anode plate.

It is a further object of the invention to define optimum angles of deposition for various wafer positions on the anode plate, based upon both concentric and fanned orientations of the wafers upon the plate.

BACKGROUND ART

In conventional sputtering of quartz the usual sputter deposition chamber utilizes a cathode and an anode spaced in opposed relationship with the wafers resting upon the anode. The spacing between the cathode and anode is normally fixed depending upon the size of the plates and other deposition parameters of the system. Since wafers worked upon in batch quantities normally have the same thickness, then the distance between the top surface of a given wafer on the anode plate to the cathode is essentially constant.

Despite this uniformity of distance it has been found that the field effects and deposition field intensity within the sputtering region vary from wafer to wafer. Accordingly, the conventional sputtering systems result in nonuniformity of quartz deposition upon the wafer. For example, in a conventional 40 MHz sputtering system adapted to deposit about 25,000 Angstroms of quartz upon each wafer, it would not be unusual to have a variation of as much as 3,000 Angstroms in the thickness of quartz deposited upon a given wafer, particularly if the wafer is located at the outer periphery of the anode plate where field effect variations are more significant. This uniformity variation is generally unsatisfactory for the processing of wafers to achieve high yields.

In particular, such a thickness variation in the quartz leads to difficulty in opening of vias in later processing steps, which results in failure of product.

In prior work described in IBM Technical Disclosure Bulletin, Vol. 19, No. 2, July 1976 pages 516–517 one of the inventors herein discloses that, in part, the variations in quartz deposition thickness can be correlated to the spacing of the top surface of the wafer from the adjacent surface of the source material. Consequently compensation for such differences in distribution can be provided by varying the individual spacing of the wafers and source in accordance with coating differences found.

One solution proposed in that publication, to achieve uniformity, utilized spacers under wafers on the anode plate to change the dimensional spacing of a given wafer with respect to the cathode.

The aforementioned system modified quartz distribution deposition thickness to some extent, particularly with respect to variations occurring in one wafer versus another in a batch. However, the solution proposed does not solve thickness variation problems existing on a given wafer within a batch.

Consequently, a need still exists for a method and apparatus for attaining satisfactory quartz deposition uniformity throughout the surface of single layers within a batch processing sputtering system.

BRIEF DESCRIPTION OF THE DRAWINGS

Other features and advantages of the invention will become apparent from the following detailed description of the invention taken in conjunction with the accompanying drawings wherein, FIG. 1 comprises a top plan view of an anode plate having concentrically arranged wafers located thereon.

DISCLOSURE OF THE INVENTION

Figure 1:
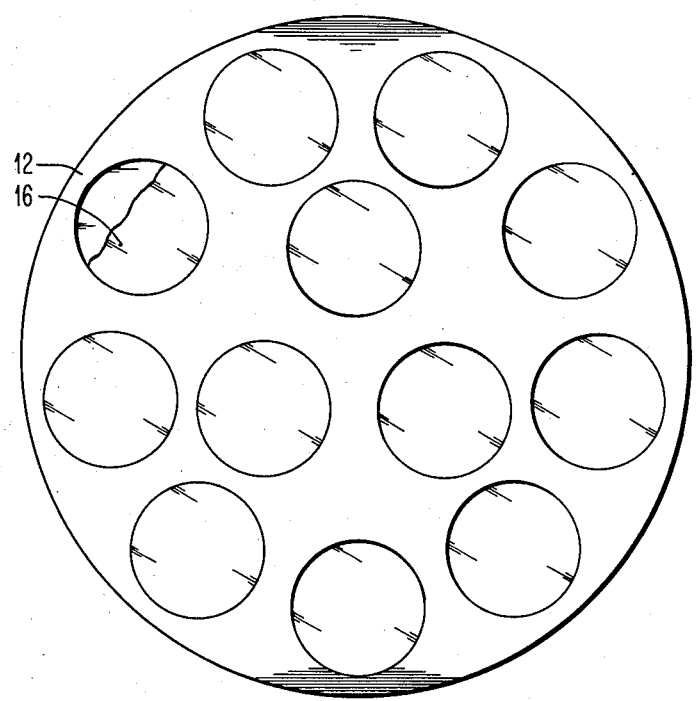
Figure 2:
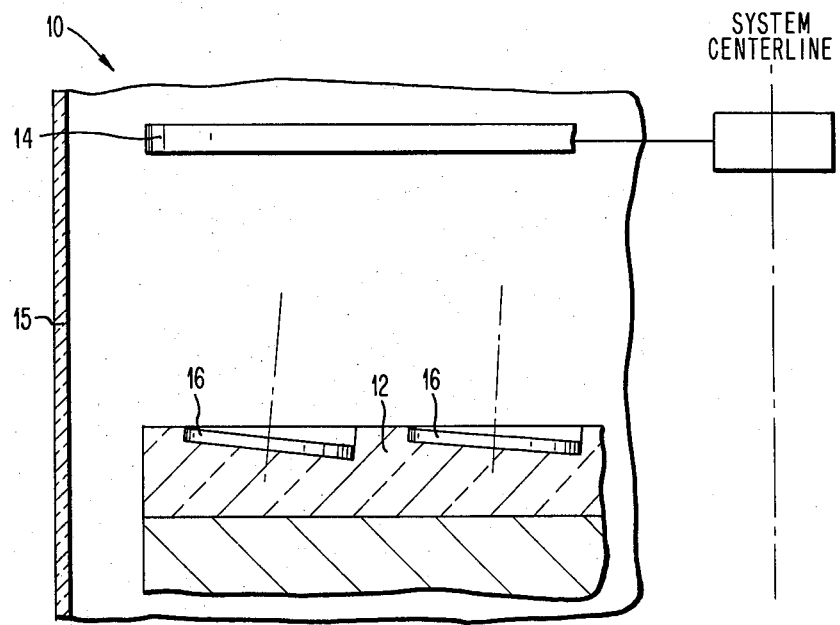
FIG. 2 is a cross section of the anode plate of FIG. 1.

Referring now to the drawings and particularly to FIGS. 1 and 2 one preferred embodiment of the invention is described comprising a sputtering system schematically indicated by numeral 10 including an anode plate 12 and a cathode plate 14 spaced apart to define a sputtering region therebetween, in well known fashion. The sputtering system comprises a conventional system confined within a chamber including wall 15. The parameters of the system can be adjusted depending upon the size of wafers to be processed and the thickness of quartz to be deposited, again in conventional fashion.

The anode plate comprises a structure adapted to twelve wafers at a time for batch processing, with each wafer being received within a cylindrical recess 16 formed in the anode plate. It should be apparent that the wafers are arranged in two rings oriented concentrically about the center of the anode plate, with nine wafers in the outer ring and three in the inner ring. The recesses receiving the wafers are formed with an angular bottom slope which tilts the wafer received therein with respect to the anode plate. All of the wafers in each ring are tilted at the same angle, but the orientation of the tilt is such that each wafer face is opened toward the center of the ring.

In the preferred embodiment, 3¾ inch wafers in the outer ring are tilted at an angle near 0.8 degrees with respect to the horizontal. The center of the wafers was located at a distance about 5 inches from the center of the anode plate. Quartz deposition of a thickness of about 24,000 Angstroms was achieved in the chamber with good planarity. This type of deposition can be carried out in conventional fashion in reactors with input power in the 3–5 kilowatt range, with anode voltage ranging from 5–850 volts and with the usual argon pressure of 10–30 microns. An inner electrode spacing of about 1 inch between anode and cathode was utilized. Deposition rates of approximately 100-500 Angstroms per minute can be achieved under such circumstances.

Figure 3:
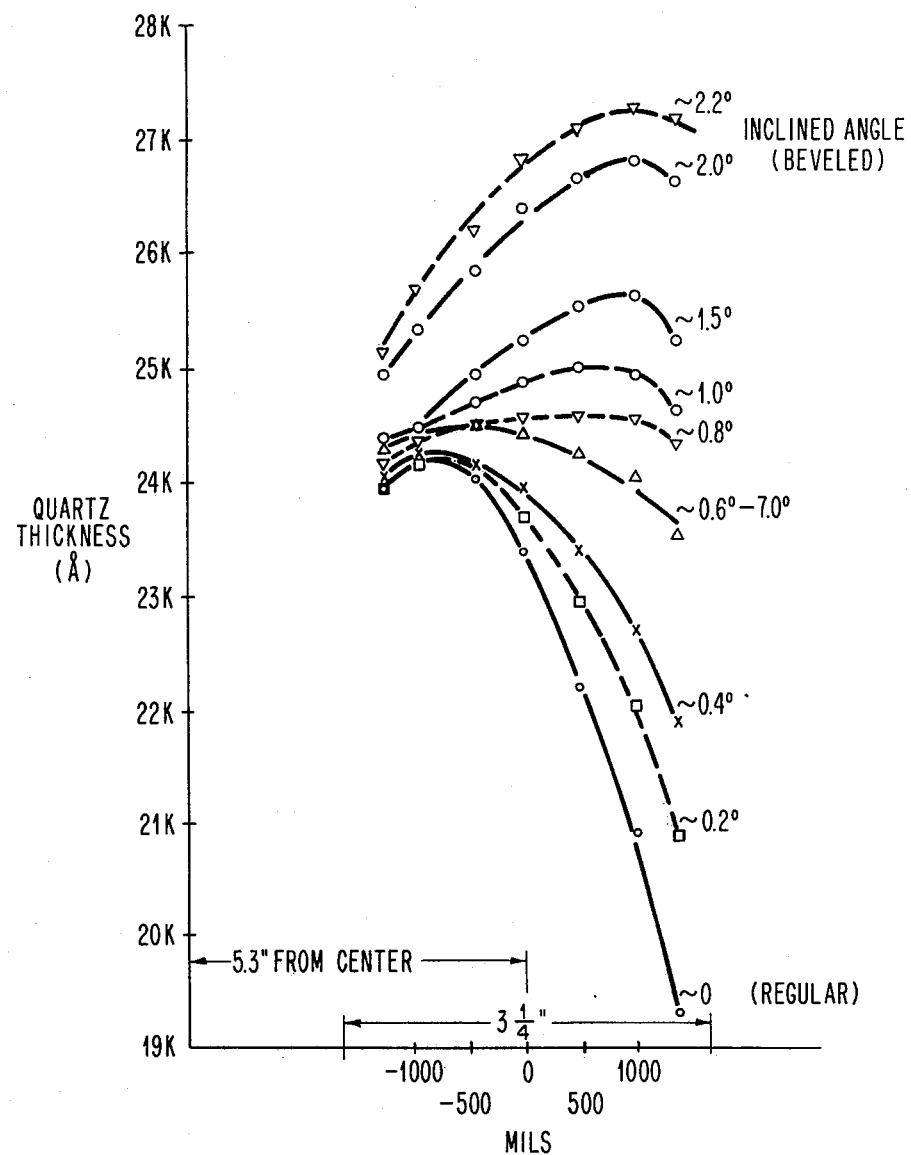
FIG. 3 is a table illustrating data relating to the invention.

FIG. 3 illustrates data taken in such a chamber with wafers oriented at different angles of tilt which demonstrates the planarity or quartz uniformity achievable at different angles of tilt with respect to the anode, again with 3¾ inch wafers oriented about 5 inches from the center of the anode. It should be apparent from the data that the uniformity or deposition planarity varies from very poor results attained at 0 degrees tilt to good results attained between 0.6 and 0.8 degrees tilt. Moreover, the data illustrates that the quartz uniformity begins to worsen as the angle of tilt exceeds 1.5 degrees and approaches 2 degrees, for example. In view of this data it is believed that the preferred or optimum of tilt is at about 0.8 degrees although angles ranging between 0.4 degrees and 1.5 degrees are certainly preferable with respect to the results attained at angles of 0 tilt or tilt beyond 2.0 degrees.

The data illustrated in FIG. 3 includes points taken by actual measurement at 0 degrees tilt, 0.4, 0.6, 1.5 and 2.0 degrees tilt. The other data points, illustrated in dotted outline in the Figure, were obtained by plotting estimates of the linear, quadratic and cubic terms of the uniformity versus angle results and reconstructing the curve for other values of tilt angle. Additional points at 0.2, 0.8, 1.0 and 2.2 are plotted with the original data. These reconstructed points appear to be consistent with and extend the range of the original data.

Thus, analyzing the data in experimental form, it appears that the plasma density, and thus the sputter removal rate at the target, increases with the radial position of the wafer with respect to the anode center to a maximum near a radial position of 5 inches. This increase is due to an increase in the radial frequency current density as it varies with respect to radial position.

The nonuniformity increases for a radial position past that of maximum plasma density. The deposition rate is determined by the amount of material incident upon the wafer, and the amount resputtered or remitted. The amount incident upon the wafer can be determined by the orientation of the wafer with respect to the anode-cathode relationship. Thus the quantity of material deposited can be increased by tilting the wafer toward an area on the target where the sputtering rate is larger. The resputtering voltage is determined by the RF voltage on the anode and the average thickness of the quartz under the wafer as that affects the capacitive coupling to the wafer. It is believed that the entire wafer is at nearly the same potential due to the conductivity of the silicon and the impedance of the anode sheet and plate.

Consequently, the dominant effect of wafer tilting appears to be an increase in the incident flux of silicon dioxide per unit area for a given position on the wafer. This in effect causes an increase of the flux to that part of the wafer where the deposition rate would otherwise be lowest. The technique described results in an improved quartz uniformity on wafers which cannot otherwise be attained in batch processing systems.

It should be apparent that other wafer configurations on the anode could be utilized, if desired. For example, wafers could be processed in different groupings, or in fanned configuration. In that event, the wafers would be located at different radii from the center of the anode. Consequently, the optimum angle of tilt for each wafer would be different from that illustrated in the preferred embodiment. However, this deposition angle can easily be identified by theoretical analysis after data is taken in a particular chamber.

The data illustrated in FIG. 3 represents the quartz thickness measured at 7 points spaced across the diameter of a given wafer. The thickness deviation for wafers oriented at an angle of 0.6 degrees is believed to be about ±2.9% whereas the thickness deviation of wafers oriented at 0 degrees amounts to over ±11%. Thus, a significant improvement in quartz uniformity is apparent. At an angle of above 2.0 degrees, the quartz uniformity begins to deteriorate; however, it is still superior to that attained without tilt.

While we have illustrated and described the preferred embodiment of our invention, it is to be understood that we do not limit ourselves to the precise construction herein disclosed and the right is reserved to all changes and modifications coming within the scope of the invention as defined in the appended claims.

Having thus described the invention, what is claimed as new and desired to be secured by Letters Patent is:

1. In a multiple wafer processing system for applying a layer on said wafers by sputter deposition,
    means for attaining improved thickness uniformity of said layer across each individual wafer comprising means for tilting each wafer to a predetermined deposition angle with respect to a reference electrode in the system as determined by the diameter of the wafer and the distance of the wafer from the center of the electrode.

2. In a multiple wafer processing system for applying a layer on said wafers by sputter deposition,
    means for attaining improved thickness uniformity of said layer across each individual wafer comprising means for tilting the wafer to an angle of about 0.8 degrees with respect to the cathode of the system where the wafer is about 3 inches in diameter and its center is located about 5 inches from the center of the cathode.

3. In a multiple wafer processing system for applying a layer on said wafers by sputter deposition,
    means for attaining improved thickness uniformity of the layer across each individual wafer comprising means for tilting the wafers to an optimum deposition angle with respect to the cathode in the system where the optimum angle is selected from the range of 0.4 degrees to 1.0 degrees for 3.25 inch diameter wafers oriented from 3-6 inches from the center of the cathode and the angle is selected from the range of 0.6 to 1.2 degrees for 3.25 inch diameter wafers oriented from 6-10 inches from the center of the cathode.

4. In a multiple wafer processing system for applying a layer on said wafers by sputter deposition,
    means for attaining improved thickness uniformity of the layer across each individual wafer comprising means for tilting the wafers to an optimum deposition angle with respect to the cathode in the system where the optimum angle is selected from the range of 0.8 to 1.4 degrees for 5 inch diameter wafers oriented from 8-12 inches from the center of the cathode.

* * * * *